(12) United States Patent
Memis

(10) Patent No.: US 7,332,818 B2
(45) Date of Patent: Feb. 19, 2008

(54) MULTI-CHIP ELECTRONIC PACKAGE WITH REDUCED LINE SKEW AND CIRCUITIZED SUBSTRATE FOR USE THEREIN

(75) Inventor: Irving Memis, Vestal, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 280 days.

(21) Appl. No.: 11/127,160

(22) Filed: May 12, 2005

(65) Prior Publication Data

US 2006/0255460 A1     Nov. 16, 2006

(51) Int. Cl.
*H01L 23/538* (2006.01)
(52) U.S. Cl. ......... 257/776; 257/E23.07; 257/E23.151; 257/E23.175
(58) Field of Classification Search ................ 257/692, 257/698, 776, E23.07, E23.151, E23.175
See application file for complete search history.

(56) References Cited

U.S. PATENT DOCUMENTS

| | | | |
|---|---|---|---|
| 4,882,454 A | 11/1989 | Peterson et al. | |
| 5,026,624 A | 6/1991 | Day et al. | |
| 5,072,075 A | 12/1991 | Lee et al. | |
| 5,121,190 A | 6/1992 | Hsiao et al. | |
| 5,287,247 A * | 2/1994 | Smits et al. ............. | 361/707 |
| 5,300,402 A | 4/1994 | Card, Jr. et al. | |
| 5,483,421 A | 1/1996 | Gedney et al. | |
| 5,574,630 A | 11/1996 | Kresge et al. | |
| 5,615,087 A | 3/1997 | Wieloch | |
| 5,661,089 A | 8/1997 | Wilson | |
| 5,798,563 A | 8/1998 | Feilchenfeld et al. | |
| 5,838,063 A | 11/1998 | Sylvester | |
| 5,849,610 A | 12/1998 | Zhu | |
| 5,894,173 A | 4/1999 | Jacobs et al. | |
| 5,900,675 A | 5/1999 | Appelt et al. | |
| 5,926,377 A | 7/1999 | Nakao et al. | |

(Continued)

FOREIGN PATENT DOCUMENTS

JP     1-307294     12/1989

(Continued)

OTHER PUBLICATIONS

Kiani, Sepehr et al., A New Method to Interconnect PCB Layers in GHz Frequency Range, IEEE, Electronic Components and Technology Conference 2000 Proceedings. 50th, meeting date May 21, 2000-May 24, 2000, http://ieeexplore.ieee.org/xpl/freeabs_all.jsp?arnumber=853191.*

(Continued)

*Primary Examiner*—Steven Loke
*Assistant Examiner*—Earl Taylor
(74) *Attorney, Agent, or Firm*—Hinman, Howard & Kattell, LLP; Lawrence R. Fraley

(57) ABSTRACT

An electronic package which includes a circuitized substrate having at least two electrical components positioned thereon. The package includes patterns of contact sites, each for having one of the components coupled thereto. The patterns of contact sites in turn are electrically interconnected by a grouping of conductive lines which, to substantially prevent skew, are of substantially the same length. A method of making the package is also provided, as is a circuitized substrate and an information handling system, the latter adapted for having one or more of the electronic packages as part thereof.

9 Claims, 4 Drawing Sheets

U.S. PATENT DOCUMENTS

| | | | |
|---|---|---|---|
| 5,982,630 A | 11/1999 | Bhatia | |
| 6,161,215 A | 12/2000 | Hollenbeck et al. | |
| 6,246,010 B1 | 6/2001 | Zenner et al. | |
| 6,351,393 B1 | 2/2002 | Kresge et al. | |
| 6,442,057 B1 | 8/2002 | Song et al. | |
| 6,627,999 B2 * | 9/2003 | Akram et al. | 257/778 |
| 6,662,250 B1 * | 12/2003 | Peterson | 710/100 |
| 6,677,668 B1 * | 1/2004 | Lin | 257/685 |
| 6,683,503 B2 | 1/2004 | Mizuno et al. | |
| 6,836,163 B2 | 12/2004 | Spehar | |
| 2003/0080417 A1 * | 5/2003 | Oka | 257/734 |
| 2003/0089978 A1 * | 5/2003 | Miyamoto et al. | 257/723 |

FOREIGN PATENT DOCUMENTS

| | | |
|---|---|---|
| JP | 6-112271 | 4/1994 |
| JP | 9-232376 | 9/1997 |
| JP | 10-209347 | 8/1998 |
| JP | 11-087560 | 3/1999 |
| JP | 2000-022071 | 1/2000 |
| JP | 2000-024150 | 1/2000 |

OTHER PUBLICATIONS

Definition of "Ball Grid Array".*

IBM TDB, "Multi Chip Cooling Plate", Jul. 1978, pp. 745-746.

IBM TDB, "Simultaneous Chip Placement—Multi-Chip Modules", Feb. 1982, pp. 4647-4649.

IBM TDB, "High Performance Multi-Chip Module", Nov. 1987, pp. 437-439.

IBM TDB, "Low-Cost, High-Power, Multi-Chip Module Design", Aug. 1988, pp. 451-452.

IBM TDB, "Thermally Conductive Substrate Mounted Multi-Chip Module Cap", Sep. 1993, pp. 623-624.

* cited by examiner

US 7,332,818 B2

MULTI-CHIP ELECTRONIC PACKAGE WITH REDUCED LINE SKEW AND CIRCUITIZED SUBSTRATE FOR USE THEREIN

CROSS REFERENCE TO CO-PENDING APPLICATIONS

In Ser. No. 10/354,000, filed Jan. 30, 2003, there is defined a printed circuit board (PCB) which is capable of providing high speed interconnections between two or more components such as chips or modules (chip carriers) mounted thereon. This PCB is specifically designed to accommodate the increased operational requirements for electronic structures such as electronic modules which mount on the PCBs and are coupled together through the board's circuitry. One particular increase that this PCB accommodates is the need for higher frequency connections between the mounted components, which connections, as stated, occur through the underlying host PCB. Such connections are subjected to the detrimental effects, e.g., signal deterioration, caused by the inherent characteristics of such known PCB wiring. For example, signal deterioration is expressed in terms of either the "rise time" or the "fall time" of the signal's response to a step change. The deterioration of the signal can be quantified with the formula $(Z_0*C)/2$, where $Z_0$ is the transmission line characteristic impedance, and C is the amount of the via capacitance. In a wire having a typical 50 ohm transmission line impedance, a plated through hole "via" having a capacitance of 4 pico farad (pf) would represent a 100 pico-second (p,s) rise-time (or fall time) degradation, as compared to a 12.5 ps degradation with a 0.5 pf buried via of the present invention, as discussed below. This difference is significant in systems operation at 800 MHz or faster, where there are associated signal transition rates of 200 ps or faster. Ser. No. 10/354,000 is now U.S. Pat. 6,828,514.

TECHNICAL FIELD

The present invention relates, in general, to an electronic package for mounting of integrated circuits, and in particular, to such packages which include at least one circuitized substrate and a plurality of semiconductor chips and/or chip carriers having such chips mounted thereon.

In Ser. No. 10/394,107, filed Mar.24, 2003, there is defined a multi-chip electronic package which utilizes an organic, laminate chip carrier and a plurality of semiconductor chips positioned on an upper surface of the carrier. The organic, laminate chip carrier is comprised of a plurality of conductive planes and dielectric layers and couples the chips to underlying conductors on the bottom surface thereof. The carrier may include a high-speed portion to assure high-frequency connection between the semiconductor chips and may also include an internal capacitor and/or thermally conductive member for enhanced operational capabilities. Ser. No. 10/394,107 is now U.S. Pat. No. 7.035.113.

In Ser. No. 10/661,616, filed Sep. 15, 2003, there is defined a multi-chip electronic package which utilizes an organic, laminate chip carrier and a pair of semiconductor chips positioned on an upper surface of the carrier in a stacked orientation. The organic, laminate chip carrier is comprised of a plurality of conductive planes and dielectric layers and couples one or both of the chips to underlying conductors on the bottom surface thereof. The carrier may include a high-speed portion to assure high-frequency connection between the semiconductor chips and may also include an internal capacitor and/or thermally conductive member for enhanced operational capabilities. The first chip, e.g., an ASIC chip, is solder bonded to the carrier while the second chip, e.g., a memory chip, is secured to the first chip's upper surface and coupled to the carrier using a plurality of wire-bond connections. Ser. No. 10/661,616 is now U.S. Pat. No. 6.992.896.

BACKGROUND OF THE INVENTION

Electronic packages, as mentioned herein, are known which include a circuitized substrate such as a printed circuit board, chip carrier, or other laminated structure as the base for having one or more semiconductor chips mounted thereon and electrically coupled to other components on the substrate as well as within the overall electronic assembly (e.g., a personal computer, mainframe or server) in which the package is positioned. Many of today's packages include, as also indicated, a substrate of laminate construction in which various conductive and dielectric layers are stacked together with selected elements of the conductive layers electrically connected to corresponding elements of other layers, typically through a conductive "via." The dielectric layers are typically of a fiberglass-reinforced epoxy resin (also known as "FR4") or like material while the conductive layers are typically copper, and may be in the form of signal, power or ground layers. Laminate structures have been and continue to be developed for many applications. These are displacing ceramic substrates in many chip carrier applications, because of reduced cost and enhanced electrical performance. The use of a multi-layered interconnect structure such as an organic, laminate chip carrier for interconnecting semiconductor chips to one another and to a printed circuit board in an electronic package introduces many challenges, one of which is the reliability of the connection joints between the semiconductor chip and the organic chip carrier, and another of which is the reliability of the connection joints between the organic chip carrier and the printed circuit board. Other challenges are identified below.

As semiconductor chip input/output (I/O) counts increase beyond the capability of peripheral lead devices and as the need for both semiconductor chip and printed circuit board miniaturization increases, area array interconnects are the preferred method for making large numbers of connections between one or more semiconductor chips on an organic chip carrier or printed circuit board, as well as between modules (packages) mounted on a printed circuit board (such modules are also referred to as packages and may include a substrate with one or more chips and a covering housing and/or heat sink, in addition to other elements). If the coefficient of thermal expansion (CTE) of the semiconductor chip, the organic chip carrier, and the printed circuit board are substantially different from one another, industry standard semiconductor chip array interconnections to the organic chip carrier can exhibit high stress during operation (thermal cycling). Similarly, the industry standard ball grid array (BGA) interconnections between the organic chip carrier and printed circuit board can also exhibit high stress during operation. Significant reliability concerns may then become manifest by failure of the connections or even failure of the integrity of the semiconductor chip (chip cracking). These reliability concerns significantly inhibit design flexibility. For example, semiconductor chip sizes may be limited or interconnect sizes, shapes and spacing may have to be customized beyond industry standards to reduce these stresses. These limitations may limit the electrical performance advantages of the organic electronic package or add significant cost to the electronic package. Typically a semiconductor chip has a CTE of 2-3 parts per million per degree Celsius (ppm/° C.) while a standard printed circuit board has a much greater CTE of 17-20 ppm/° C. A chip carrier, with usually a plurality of dielectric layers and conductive layers as part thereof, typically has a CTE somewhere between these two structures.

One example of an organic chip carrier designed to overcome such CTE and related problems is defined in U.S. Pat. No. 6,351,393 (J. S. Kresge et al) which includes a specific thermal internally conductive layer designed to prevent failure between the single chip and the carrier solder connections, and those between the carrier and base substrate (e.g., PCB) on which it is positioned.

Another significant concern with respect to high density wiring arrays is line skew, in which lines of different lengths between respective chip and substrate contact sites, as well as between different chip sites, cause the signals therethrough to arrive at the designated locations at different times. This in turn may degrade system performance as well as lead to errors in data communication, two problems especially relevant to chip packages with a plurality of chips such as a main processor chip and adjacent memory chips. The extreme closeness of positioning between such chips necessitates that the several connecting lines between the chips be positioned in a minimum of spacing both on and within the laminate substrate. Signal speed requirements for such packages are also extremely high. To satisfy such demands in such limited spacing requirements, the circuit designer is in turn limited as to how best to place all such lines, and still assure routing between all required points. To accomplish this, he/she has found it necessary to often connect the shortest distances first with short lines and then attempt to accomplish all additional connections with whatever line scheme will satisfy the grid. As explained below, such long lines extend considerably outwardly, especially when coupling component sites having several individual contacts as part thereof. The result, as explained above, is the undesirable signal arrival times and corresponding problems associated therewith.

The following patents describe line skew for circuits and various means for dealing with same.

In U.S. Pat. No. 6,836,163, issued Dec. 28, 2004, there is described a differential output structure with minimal skew and less process variations. According to one embodiment, the structure includes an input line, an output driver and a sync circuit. The input line includes first and second paths. The first path has an input end for receiving input signals. The first path also has an output end and includes at least one driving element. The second path has an input end coupled to the input end of the first path for receiving the input signals. The second path also has an output end. The output driver is coupled to the output ends of the first and second paths and is configured to provide differential outputs. The sync circuit is coupled between the first and second paths and is configured to synchronize the speed of signals traveling on the two paths.

In U.S. Pat. No. 6,683,503, issued Jan. 27, 2004, there is described an oscillation circuit which provides clock signals and a clock distribution of circuits having low skew and low jitter to logic circuits and memory circuits of a microprocessor or the like. The oscillation circuit is in a semiconductor integrated device having a plurality of oscillators each having an oscillation node, where the oscillation nodes of each of the oscillators are connected together by a conductive wiring line that may be a closed loop. The oscillators are synchronized to oscillate at substantially the same frequency. The oscillators are connected to the conductive wiring line at connecting points having substantially the same interval of conductive wiring lengths between the connection points, which leads to synchronizing the oscillators to oscillate with a substantially identical phase. The conductive line can also be formed in the shape of a mesh. The oscillators are ring oscillation circuits having inverters connected in a ring shape where an output of at least one inverter of each ring oscillation circuit is connected to the conductive wiring. Alternatively, the oscillators may be delay lines having multistage connected inverters with at least one inverter connected to the conductive wiring line.

In U.S. Pat. No. 6,442,057, issued Aug. 27, 2002, there is described a memory "module" for preventing bus line skew. The memory module includes a PCB, memory chips, module tabs and bus lines. The memory chips are disposed on the PCB, and the module tabs are disposed at one edge of the PCB. The bus lines are connected to the module tabs, respectively, and are connected to the memory chips. Each of the bus lines is a closed loop and is connected to the memory chips through a circuitous or roundabout path which includes first and second paths of, in general, different lengths. The first and second paths of the roundabout path branch from each other at a position on the closed loop.

In U.S. Pat. No. 6,161,215, issued Dec. 12, 2000, signal delay and skew within an integrated circuit are minimized when signals are distributed to distant points of an integrated circuit through a layer of its package, and traces in the package layer are etched and treated as transmission lines. As mentioned, a signal is driven through a first connection between an integrated circuit and an integrated circuit package layer. The signal is then distributed to one or more additional connections between the integrated circuit package layers, by means of point-to-point transmission lines formed in the package layer, each of the transmission lines being terminated at one or both ends by impedances which are substantially matched to the characteristic impedance of the transmission line to which these are attached. The signal is then received into the integrated circuit through the one or more additional connections between the integrated circuit and the package layer.

In U.S. Pat. No. 5,849,610, issued Dec. 15, 1998, there is described a methodology of constructing a planar equal path length clock tree. Prior computer-generated methods of creating low-skew clock trees required that clock sinks be uniformly distributed throughout the circuit. Moreover, the tree produced would often be non-planar, thus increasing layout design complexity and cost. This patent describes a method of automatically producing a planar clock tree with equal path lengths from each clock sink to the clock source. A first branch wire is formed between the clock source and the clock sink that is a farthest distance from the clock source. Thereafter, the remaining uncoupled clock sinks are coupled to the clock tree according to a maximum rule and a minimum rule. Thus a planar equal path length clock tree is formed. The planar equal path length clock tree is transformed in to a rectilinear clock tree, including horizontal and vertical wires, by using a line search algorithm. The rectilinear clock tree may then be optimized for tolerable clock skew by a cut-and-link method.

Examples of other packaging structures are shown and described in the following documents:

| U.S. Patents | | |
|---|---|---|
| 4,882,454 | November 1989 | Peterson et al |
| 5,072,075 | December 1991 | Lee et al |
| 5,121,190 | June 1992 | Hsiao et al |
| 5,483,421 | January 1996 | Gedney et al |
| 5,615,087 | March 1997 | Wieloch |
| 5,661,089 | August 1997 | Wilson |
| 5,798,563 | August 1998 | Fielchenfeld et al |
| 5,838,063 | November 1998 | Sylvester |
| 5,894,173 | April 1999 | Jacobs et al |
| 5,900,675 | May 1999 | Appelt et al |
| 5,926,377 | July 1999 | Nakao et al |
| 5,982,630 | November 1999 | Bhatia |
| Foreign Patent Documents | | |
| JP | 1-307294 | December 1989 |
| JP | 6-112271 | April 1994 |
| JP | 9-232376 | September 1997 |
| JP | 10-209347 | August 1998 |
| JP | 11-087560 | March 1999 |
| JP | 2000-022071 | January 2000 |
| JP | 2000-024150 | January 2000 |

As mentioned in the last two of the three foregoing pending patent applications, to increase the operational characteristics of electronic packages, the addition of more than one chip to the upper surface of a chip substrate is known. (Both of these pending applications also define examples of how such chips may be positioned and coupled, using non-ceramic materials for the dielectric layering.) Because use of added chips in a close spacing relationship results in increased operating temperatures from the chips, many structures (other than those in the pending applications) require the much higher temperature compensating substrate material ceramic as the underlying substrate material, with various examples described in the following IBM Technical Disclosure Bulletins (TDBs):

| 07/1978 | Multi Chip Cooling Plate | pp 745-746 |
|---|---|---|
| 02/1982 | Simultaneous Chip Placement - Multi-Chip Modules | pp 4647-4649 |
| 11/1987 | High Performance Multi-Chip Module | pp 437-439 |
| 08/1988 | Low-Cost, High-Power, Multi-Chip Module Design | pp 451-452 |
| 09/1993 | Thermally Conductive Substrate Mounted Multi-Chip Module Cap | pp 623-624 |

As mentioned, the use of ceramic poses many problems, a primary one of which is handling. Ceramic is a relatively brittle material capable of cracking and chipping if handled improperly during manufacture and shipping. Ceramic is also a relatively difficult material to process, especially to the multi-depth level where several individual layers of insulative and interconnecting conductive materials are needed to satisfy many operational requirements. To overcome these problems, the pending applications define structures which do not require ceramic insulative material, but which instead are capable of using non-ceramics.

In addition to the above-cited two pending applications, chip carriers of non-ceramic material have been proposed, but these typically possess various drawbacks. In U.S. Pat. No. 5,574,630, for example, three chips are mounted on a substrate comprised of silica-filled polytetrafluoroethylene (PTFE) but require individual vias to pass through the carrier's entire this structure in turn mandates utilization of a complex "power/ground assembly" of several layers having specific CTEs and other properties, thus resulting in a very expensive final assembly and one that is relatively difficult to construct.

Yet another non-ceramic substrate embodiment for having more than one chip thereon is described in U.S. Pat. No. 6,246,010. Unfortunately, the substrates require semiconductor chips which are extremely thin (less than 100 μm, preferably less than 50 μm, and "most preferably" less than 20 μm). Understandably, such thinned chips are incapable of adequately providing the much greater operational capabilities as required by today's more powerful chips (e.g., those of the application specific integrated circuit (ASIC) variety). Typically, such chips operate at much higher temperatures than other types (e.g., those of the dynamic random access memory (DRAM) variety).

A typical high performance PCB, prior to the one defined in U.S. Pat. No. 6,828,514 (cited above), has not been able to provide wiring densities beyond a certain point due to limitations imposed by the direct current (DC) resistance maximum in connections between components (especially chips). Similarly, high speed signals demand wider lines than normal PCB lines to minimize the "skin effect" losses in long lines. To produce a PCB with all wide lines would be impractical, primarily because of the resulting excessive thickness needed for the final board. Such increased thicknesses are obviously unacceptable from a design standpoint. As mentioned, high speed signal requirement are especially typical in chip carrier applications, especially those which use at least one main processor chip and one or more added memory chips which operate in combination therewith.

The unique characteristics of the PCB in U.S. Pat. No. 6,828,514 allow it to be able to assure high frequency connections while still utilizing relatively standard PCB manufacturing processes to produce the final structure. In this pending application, a portion of the PCB is dedicated to utilizing relatively wider lines than the remaining, lower portion of the PCB, which includes lines and spacings known in the PCB field.

All of the above documents are incorporated herein by reference.

It is believed that an electronic package which can utilize a substrate with high density wiring and which can effectively interconnect two or more chips mounted on the substrate such that high speed signals can pass through the closely spaced lines and assure substantially similar arrival times in a manner not suggested in the cited documents above would constitute a significant advancement in the art. It is further believed that such a package, which can also provide for effective coupling between two or more conductive signal layers within the package's substrate, would also constitute an art advancement. Equally important, it is believed that such a package which can overcome many of the disadvantages cited above for many known multi-chip structures, including particularly those associated with CTE mismatch, would truly be an art advancement.

OBJECTS AND SUMMARY OF THE INVENTION

It is, therefore, a primary object of the present invention to enhance the art of electronic packages such as chip carriers including more than one chip as part thereof, such packages also known in the art as multi-chip electronic packages (or modules).

It is another object of the invention to provide such a package which assures high speed connections between the chips thereon to assure substantially similar signal arrival times at designated destination points.

It is yet another object of this invention to provide such a package which assures effective coupling between two or more conductive layers of the package, to thus provide alternative routing patterns for the package's signal lines.

It is a further object of the invention to provide such a package which is capable of providing such connections for high temperature chips such as those of the ASIC variety without adversely affecting the CTE properties of the various elements of the final package.

It is still another object of the invention to provide such a package which can be produced in a cost effective manner while assuring a final structure of robust construction.

Further, it is another object of the invention to provide a package-substrate assembly utilizing the package of the invention as part thereof, the assembly thus benefiting from the unique advantages of the multi-chip carrier defined herein.

It is still another object of the invention to provide a method of making an electronic package including a substrate and a plurality of chips mounted on one surface thereof, which method can be completed in a facile and relatively inexpensive manner, thus resulting in a final end product of reduced cost.

According to one aspect of the invention, there is provided an electronic package comprising a circuitized substrate including a conductive layer having at least two spaced apart patterns of electrical component contact sites, each of said patterns of electrical component contact sites including at least twenty such contact sites, and a plurality of conductive lines interconnecting selected ones of said contacts sites of one of said patterns of electrical component contact sites with selected ones of said contact sites of a second of said patterns of electrical component contact sites, said plurality of conductive lines being of substantially the same length; and at least two electrical components positioned on said circuitized substrate, each of said electrical components being electrically coupled to a respective one of said patterns of electrical component contact sites and therefore to one another by said plurality of conductive lines of said substantially same length.

According to another aspect of the invention, there is provided method of making an electronic package, said method comprising: providing at least one dielectric layer; providing a conductive layer on said at least one dielectric layer having at least two spaced apart patterns of electrical component contact sites, each of said patterns of electrical component contact sites including at least twenty such contact sites, and a plurality of conductive lines interconnecting selected ones of said contacts sites of one of said patterns of electrical component contact sites with selected ones of said contact sites of a second of said patterns of electrical component contact sites, said plurality of conductive lines being of substantially the same length, said at least one dielectric layer and said conductive layer forming a circuitized substrate; positioning at least two electrical components on said circuitized substrate; and electrically coupling each of said electrical components to a respective one of said patterns of electrical component contact sites and therefore to one another by said plurality of conductive lines of said substantially same length.

According to a third aspect of the invention, there is provided an information handling system comprising: a housing; at least one electronic package positioned within said housing, said electronic package including a circuitized substrate including a conductive layer having at least two spaced apart patterns of electrical component contact sites, each of said patterns of electrical component contact sites including at least twenty such contact sites, and a plurality of conductive lines interconnecting selected ones of said contacts sites of one of said patterns of electrical component contact sites with selected ones of said contact sites of a second of said patterns of electrical component contact sites, said plurality of conductive lines being of substantially the same length, and at least two electrical components positioned on said circuitized substrate, each of said electrical components being electrically coupled to a respective one of said patterns of electrical component contact sites and therefore to one another by said plurality of conductive lines of said substantially same length.

According to yet another aspect of the invention, there is provided a circuitized substrate comprising a conductive layer having at least two spaced apart patterns of electrical component contact sites, each of said patterns of electrical component contact sites including at least twenty such contact sites, and a plurality of conductive lines interconnecting selected ones of said contacts sites of one of said patterns of electrical component contact sites with selected ones of said contact sites of a second of said patterns of electrical component contact sites, said plurality of conductive lines being of substantially the same length.

BEST MODE FOR CARRYING OUT THE INVENTION

Figure 1:
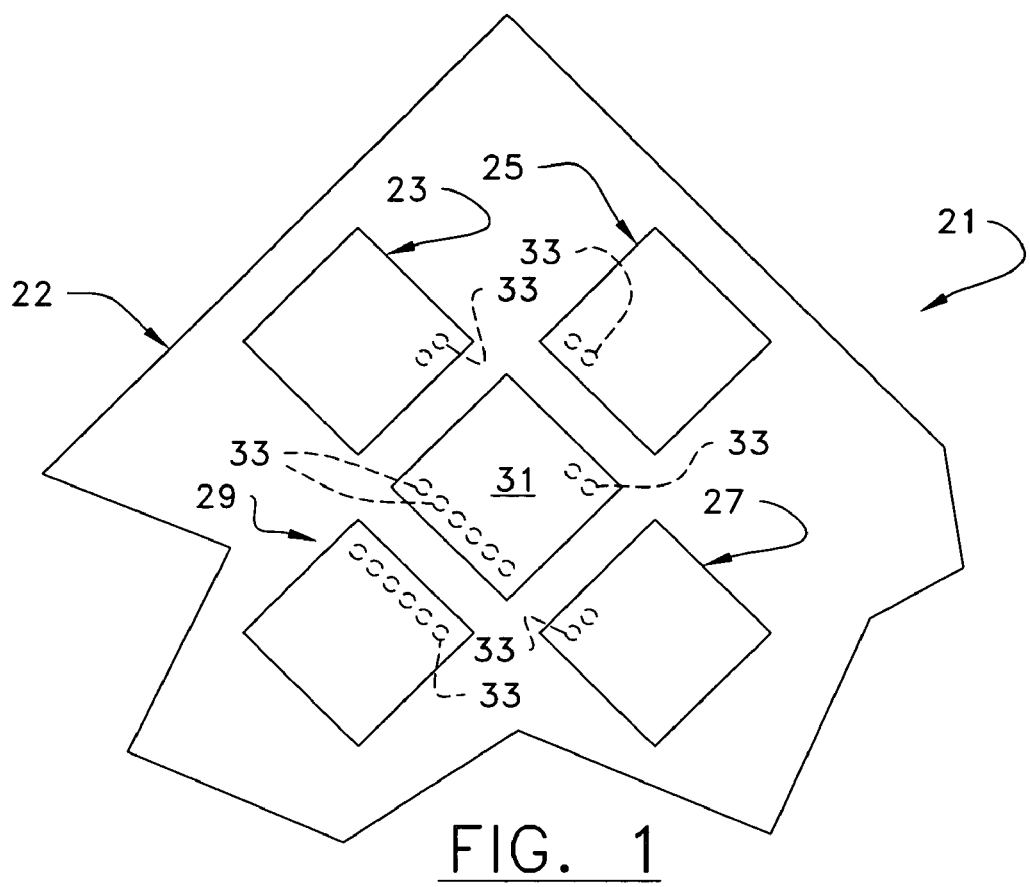
FIG. 1 is a partial plan view of an electronic package according to one embodiment of the invention.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" as used herein is meant to include substrates having at least one (and preferably more) dielectric layer(s) and at least one (and preferably more) metallurgical conductive layer(s). Examples include structures made of dielectric materials such as fiberglass-reinforced epoxy resins (some referred to as "FR-4" dielectric materials in the art), polytetrafluoroethylene (Teflon), polyimides, polyamides, cyanate resins, photo-imageable materials, and other like materials wherein the conductive layers are each a metal layer (e.g., power, signal and/or ground) comprised of suitable metallurgical materials such as copper, but may include or comprise additional metals (e.g., nickel, aluminum, etc.) or alloys thereof. Further examples will be described in greater detail herein-below. If the dielectric materials for the structure are of a photo-imageable material, it is photo-imaged or photo-patterned, and developed to reveal the desired circuit pattern, including the desired opening(s) as defined herein, if required. The dielectric material may be curtain-coated or screen- applied, or it may be supplied as dry film. Final cure of the photo-imageable material provides a toughened base of dielectric on which the desired electrical circuitry is formed. An example of a particularly useful photo-imageable dielectric is ASMDF (Advanced Soldermask Dry Film). This composition, which is further described in U.S. Pat. No. 5,026,624, which issued Jun. 25, 1991, and U.S. Pat. No. 5,300,402, which issued Apr. 25, 1994, includes a solids content of from about 86.5 to about 89%, such solids comprising: about 27.44% PKHC, a phenoxy resin; 41.16% of Epirez 5183, a tetrabromobisphenol A; 22.88% of Epirez SU-8, an octafunctional epoxy bisphenol A formaldehyde novolac resin; 4.85% UVE 1014 photo-initiator; 0.07% ethylviolet dye; 0.03% FC 430, a fluorinated polyether nonionic surfactant from 3M Company; 3.85% Aerosil 380, an amorphous silicon dioxide from Degussa to provide the solid content. A solvent is present from about 11 to about 13.5% of the total photo-imageable dielectric composition. The dielectric layers taught herein may be typically about 2 mils to about 4 mils thick, but also thicker or thinner if desired. Examples of circuitized substrates include the aforementioned printed circuit boards (or cards) and chip carriers. It is believed that the teachings of the instant invention are also applicable to what are known as "flex" circuits (which use dielectric materials such as polyimide).

As stated above, the term "high speed" as used herein is meant signals of high frequency. Examples of such signal frequencies attainable for the multilayered chip carriers and circuitized substrates (e.g., PCBs) defined herein and as produced using the methods taught herein include those within the range of from about 3.0 to about 10.0 gigabits per second (GPS). These examples are not meant to limit this invention, however, because frequencies outside this range, including those higher, are attainable. As further understood from the following, the chip carrier products produced herein may be formed of at least two separate multilayered portions (subassemblies) which have themselves been formed prior to bonding to each other. At a minimum, each of these separate portions will include at least one dielectric layer and one conductive layer, with most likely embodiments including several layers of each as part thereof.

By the term "electrical component" as used herein is meant components such as semiconductor chips and the like which are adapted for being positioned on the external conductive surfaces of circuitized substrates and electrically coupled to the substrate for passing signals from the component into the substrate whereupon such signals may be passed on to other components, including those mounted also on the substrate, as well as other components such as those of a larger electrical system which the substrate forms part of.

By the term "electronic package" is meant at least one circuitized substrate as defined herein in combination with at least two electrical components electrically coupled thereto and forming part of the package. Examples of known such packages include chip carriers which include one or more semiconductor chips as the electrical components, the chips usually positioned on the substrate and coupled to wiring (e.g., pads) on the substrate's outer surface or to internal conductors using one or more thru-holes. Perhaps the best known such assembly is the conventional printed circuit board (PCB) typically having several external components such as modules (including one or more chips), semiconductor chips, etc. mounted thereon and coupled to the internal circuitry of the PCB.

The products as defined herein are particularly adapted for use in what can be termed "information handling systems". By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc.

By the term "substantially the same length" as used herein to define the lengths of the conductive lines (or traces) of the circuit line patterns herein is meant wherein the shortest line of a grouping of such lines connecting one pattern of contact sites to another pattern of contact sites has a length at least eighty percent as long as the longest line in the same connecting grouping of such lines.

By the term "thru-hole" as used herein is meant to include what are also commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more conductive layers, e.g., plated copper, thereon. These openings are typically formed using mechanical drilling or laser ablation.

In FIG. 1, there is shown a partial view of an electronic package 21, according to one embodiment of the invention. Package 21 includes a circuitized substrate 22 having a plurality of electrical components 23, 25, 27, 29 and 31 thereon. In a preferred embodiment, each component is a semiconductor chip, or a chip carrier having at least one semiconductor chip therein. The latter component is also often referred to as a "module" in the art. Such carriers typically include a circuitized substrate with a chip mounted thereon, and usually include additional supporting structure such as heat sinks, stand-offs, etc. One well known example of such a carrier is sold under the product name "Hyper-BGA" by the Assignee of the present invention. As stated, the components may each instead be simply the semiconductor chip, sans any such supporting structure (including substrate). In a more preferred embodiment, centrally located component 31 is a carrier including main processing chip as its main functioning element. One example of such a main processing chip is a microprocessor chip, available from semiconductor suppliers such as International Business Machines (IBM), Freescale Semiconductor, Inc. etc. This chip serves to process all information and in turn is electronically and functionally coupled to the four surrounding components (23, 25, 27 and 29), each being or, if a chip carrier, including a memory chip. With such a carrier-chip combination, package 21 operates as follows. The processor simultaneously retrieves or sends information to or from the many cells of the memory components where the combined information of such cells constitutes what can be called an element of information, which is in temporary storage. This information is then re-processed by the main processor chip in accordance with programming instructions dictated by the next level of the assembly. Because the information is parallel processed with data from the individual cells recombined, it is understood that processing of such data in a very short, fixed period of time is very important to assure optimal system performance.

Having such capabilities, package 21 is ideally suited for use within an information handling system of the type defined herein, e.g., a personal computer, server or mainframe. It is understood that the invention has many other uses, and is not limited to these, however.

Figure 5:
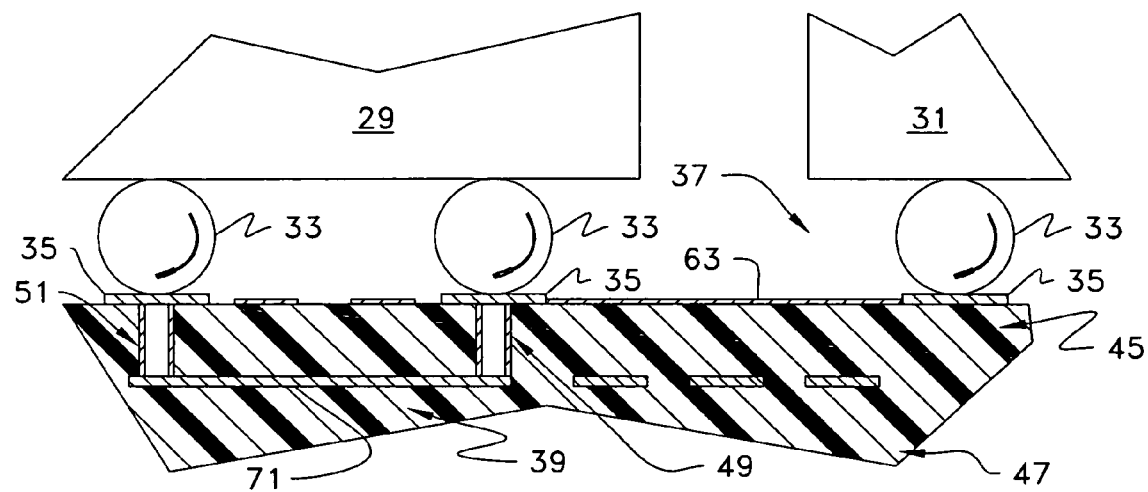
FIG. 5 is a much enlarged, partial side elevational view showing examples of how at least two conductive layers may be used to provide the line connection pattern such as shown in FIG. 4, while also showing examples of how at least two electrical components (e.g., semiconductor chips) are in turn coupled to the circuit patterns having such lines.

Each of the five components is preferably mounted on substrate 22 using solder ball connections 33 (FIG. 5). A few of such connections are shown hidden in FIG. 1, it being understood these are located beneath the components. In one example, a total of twenty solder ball connections are used for central processing component 31 and twenty connections used for each of the surrounding memory components 23, 25, 27 and 29. (The sizes and numbers of these as shown or understood from FIG. 1 are thus for illustration purposes only.) If each component is a chip carrier, the dimensions for each are about 25 um to 40 um wide, 1 mm to 10 mm long and 10 um to 20 um thick. If each component is a semiconductor chip, which is included in such a carrier, obviously these dimensions are smaller.

Figure 2:
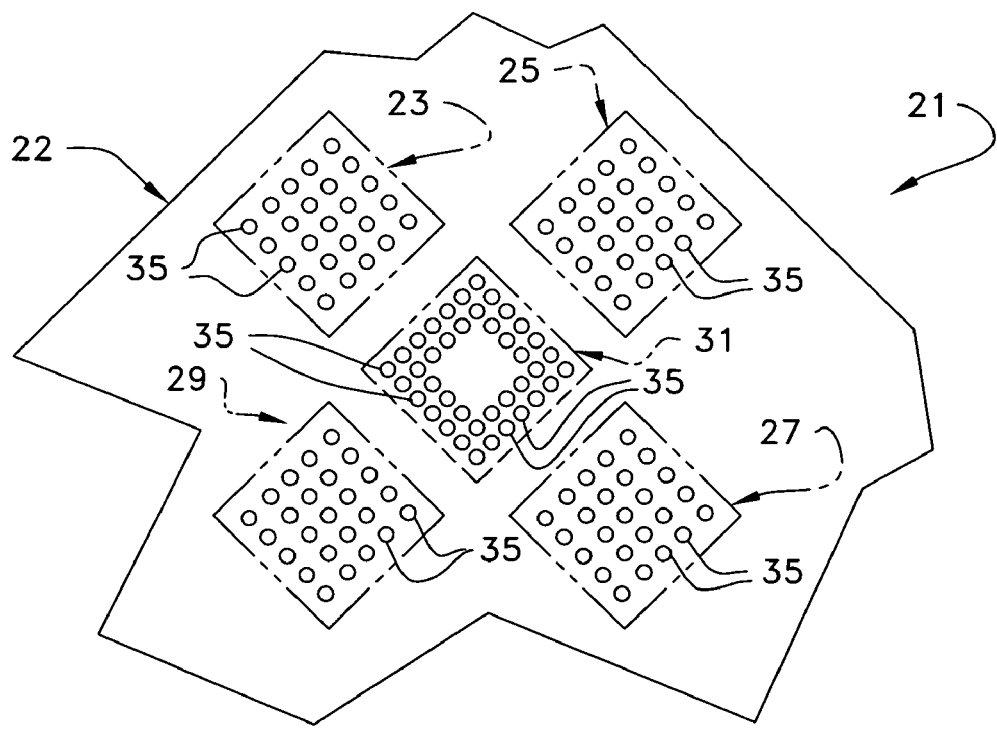
FIG. 2 is a partial plan view of the package of FIG. 1 excluding the components (e.g., semiconductor chips) but illustrating the contact sites of said components.

In FIG. 2, there are shown the five patterns of electrical component contact sites 35 for each component (shown in phantom). Each site is preferably a copper pad, the total number being the same as the number of solder ball connections which are secured thereto. In a preferred embodiment, the total number for each component pattern is at least ten, and more preferably many more (e.g., at least twenty as mentioned above). In one example, each pad has dimensions of about 0.12 mm by about 0.12 mm, if of rectangular configuration, or with a diameter of about 0.14 mm if of circular (shown) configuration, both of such configurations when viewed from above (as in FIGS. 1 and 2). As stated, contact sites of the pattern for central component 31 are preferably electrically connected to corresponding sites of the other four surrounding components, depending on the operational requirements for package 21. As understood from the following, these connections are provided by groupings of conductive lines (or traces), arranged in the unique manner taught herein.

It is understood that all of the contact sites 35 and the connecting groupings of lines (not shown in FIGS. 1 or 2) occupy at least one (and preferably more) conductive layer (s) 37 (FIG. 5). The connectivity schemes taught herein are enhanced to a great degree by the use of several such layers, with one added layer shown in FIG. 5 and represented by the numeral 39. Such layers are preferably copper and formed using conventional photolithographic processing known in the PCB manufacturing art. Typically, one layer is formed atop a corresponding dielectric layer (i.e., layer 45 in FIG. 5) using such processing and this combined dielectric-conductive sub-composite is then "stacked" up with other dielectric layer (i.e., layer 47 in FIG. 5) and conductive layer (39) sub-composites and bonded together, usually utilizing conventional lamination processes. Electrical connections between selected ones of the elements (e.g., pad or line) from one conductive layer to another is preferably provided by thru-holes, such as represented by the numerals 49 and 51. Further description of the FIG. 5 embodiment is provided below.

Figure 3:
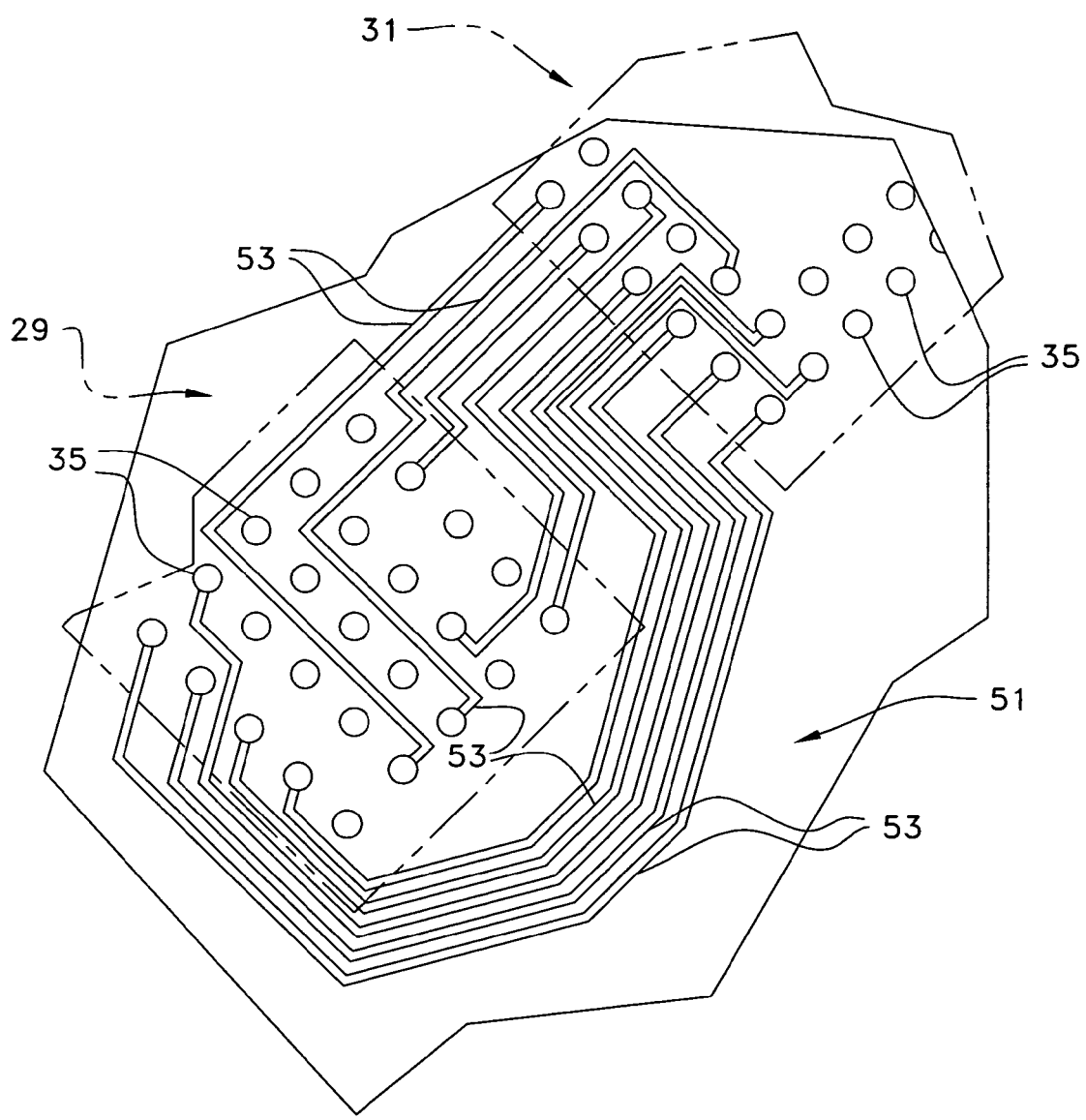
FIG. 3 is a much enlarged, partial view, representing an example of how two of the patterns of component contact sites in a known package of two or more chips have been electrically connected.

As stated, when package 21 includes the five components stated above (one main processor and four adjacent memory), the contact sites 35 of the individual memory components are selectively coupled to those of the processor component. In known arrangements, as depicted in FIG. 3, such connections are provided by a grouping 51 of lines 53. That is, a grouping of such lines couples each processor-memory pair of components, the embodiment of FIG. 3 illustrating but one such pair (29 and 31). Similar lines are used to couple processor 31 to the remaining three components, but are not further described or shown herein for ease of description purposes. In the known arrangement of FIG. 3, it is seen that different length lines are used, some of these much shorter than the longest. As mentioned, such a large disparity of line lengths (line skew) is necessitated by spacing limitations and other factors, and results in significant different signal arrival times for the signals coming from, for example, processor 31 to memory component 29, and vice versa. Overall system performance may be degraded, in addition to possible errors occurring in data communication between the respective coupled components. (The line grouping distribution or pattern as shown in FIG. 3 is intended to show, not to exacting scale, the described disparity of line lengths, and is not representative of any exact pattern known. Such patterns typically include several more lines than shown and which are much more closely positioned when of the dimensions cited above.). As a more detailed example of such line length disparity, in one known pattern, the shortest lines had lengths no longer than about seventy percent of the length of the longest lines.

Figure 4:
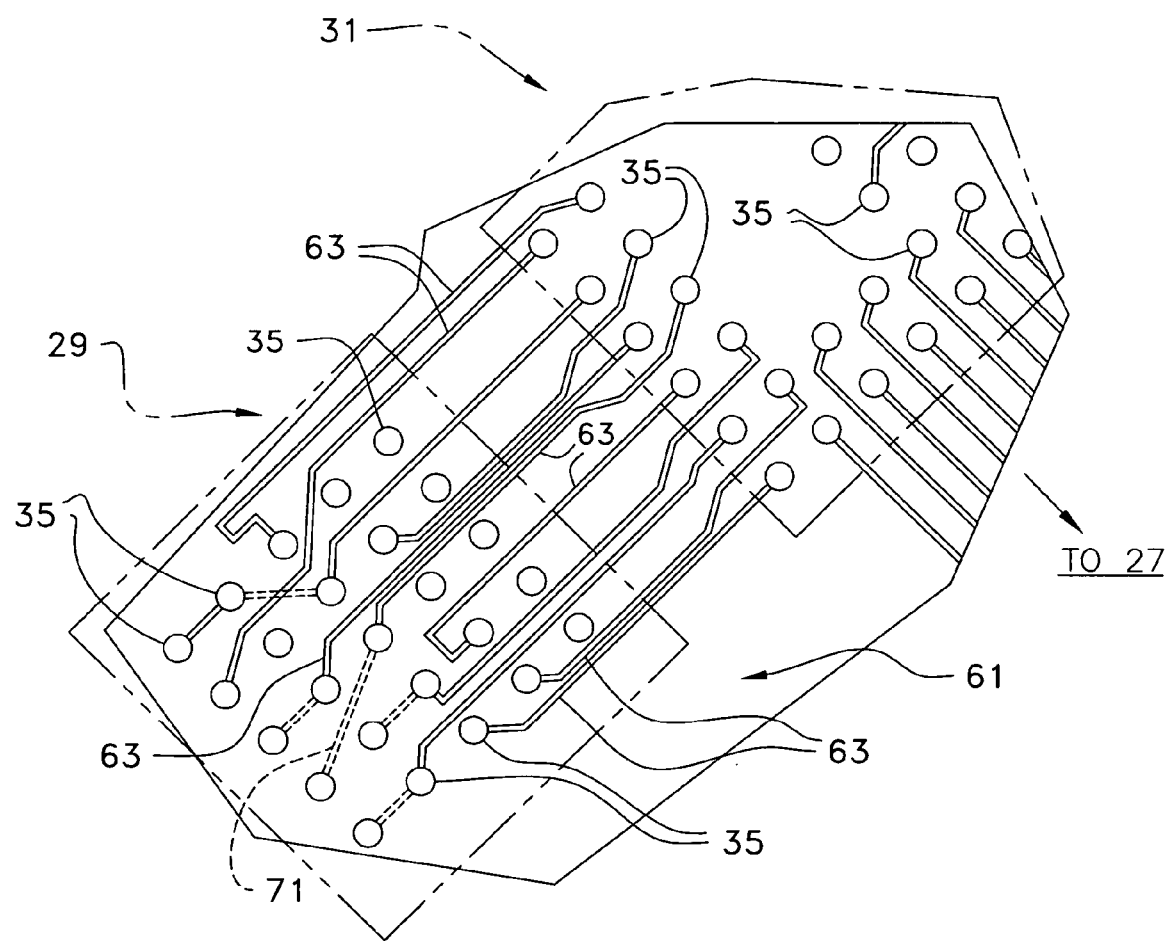
FIG. 4 is a much enlarged, partial view, representing an example of how two of the patterns of component contact sites in a package of the present invention are electrically connected.

The present invention, as represented by the grouping 61 in FIG. 4, substantially overcome the problems associated with line skew by providing lines 63 of substantially equal length. (See also FIG. 5.) As defined herein, the invention is able to do so while also assuring effective coupling of high temperature chip components without adversely affecting the CTE properties of the various components of the resulting package. As also understood, the invention is able to do so while also controlling desired impedance requirements for the various components, as defined by the package's operational characteristics. (Again, the pattern of lines shown is representative only of the fact that substantially similarly length lines are used and is not meant to represent a specific pattern other than one designed to couple contact sites 35 of one component (here, 31) to another (here, 29). A similar pattern characteristic is used for the groupings of lines connecting processor 31 to the other components. In the example shown, the line length of the shortest line(s) is(are) no less than about eighty-five percent of the overall line length of the longest line(s). These lines are provided in preferably the same manner (photolithographic processing) for other circuit lines, and further description is not deemed necessary. All occupy at least one conductive layer for package 21, and, as mentioned, these occupy more such layers (as shown in FIG. 5). In a significant aspect of the invention, the line lengths are "shared" between the two planes (and others if desired) in that a line emanating from a site 35 of processor 31 is directly coupled on the upper conductive layer to a first site 35 of memory component 29, but then passes down through the underlying dielectric layer 45 to the second, underlying conductive layer 39, where it passes, directly, to a second site 35 of the memory component. Such connections are shown hidden in the plan view of FIG. 4, with one example represented by the numeral 71 in FIGS. 4 and 5. Several such lower connections may be used for the invention, and the invention is not limited to the representative example shown herein. As stated, it is also possible for some line connections to pass to further conductive layers within the substrate, and coupled thereto also using such connections as thru-holes. These added connections are not shown for ease of explanation. Of further significance, one or more lines may be convoluted so as to "double back" or take a longer, more circuitous route to assure that it will fall within the range described. Still further, with thru-holes of the small dimensions cited herein, the lengths thereof are deemed entirely insignificant and thus not included in the line length dimensions.

It is also seen in FIG. 4 that others of the contact sites for component 31 are coupled to another component (here, 27). In a preferred embodiment, the contact sites 35 for component 31 are peripheral in that two or more rows thereof are more closely located to the outer periphery (a respective side) of component 31, and not further inwardly (and thus further under) the component. The contact sites for such memory components may be substantially entirely under the component body, as shown in FIG. 2 as well. Such positioning of these sites, considering the extremely small dimensions of spacings thereof and of the lines and sites themselves, makes it all the more difficult to effectively couple these with substantially equal length connections. The invention is able to do so, as explained and shown herein, and thus represents a significant advancement in the art. In one embodiment, the grouping of lines between processor component 31 and each of the surrounding memory components numbered from about 100 to about 300 lines, a very high number and further representative of the high densities attainable using this invention.

In the FIG. 5 embodiment, the corresponding dielectric layers 45 and 47 may each possess a thickness of from about 0.030 mm to about 0.050 mm. The total number of both such layers may exceed ten in total. The material for conductive layers 37 and 39, as explained, is preferably copper, but other conductive materials are possible. Each line may in turn possess a thickness of only about 0.015 mm. If pads are used for the contact sites, each will have a thickness of only about 0.015 mm. The preferred dielectric material is a low loss dielectric, one example being Polyclad LD621, available from Cookson Electronics, located in West Franklin, N.H. Additional materials include Nelco 6000SI, available from Park Nelco, located in Newburgh, N.Y., and Rogers 4300, available from Rogers Corporation, located in Rogers, Conn. These materials have a low dielectric constant and loss factor to provide the optimum operational capabilities for package 21. Other materials possessing dielectric loss ≦0.01, and preferably less than <0.005 would be suitable. This dielectric material may be other than the above, with examples mentioned in detail above. It is understood that the above thicknesses and defined materials are not meant to limit the scope of this invention, in that others are possible while attaining the desired results taught herein. In one example, using the aforementioned thicknesses and materials, it is possible to pass signals at a signal frequency within the range of from about 3 to about 10 GPS. This is also not meant to limit the invention in that higher frequencies, e.g., 12 GPS, are possible with relatively insignificant modification to one or more of the above materials, parameters, etc.

It is understood in FIG. 5 that two or more semiconductor chips can be mounted on each of the opposite sides of the package, if desired, and coupled together (including with high frequency signals), should the carrier include a modified lower surface or other means to couple it to the underlying PCB on which it is to be positioned and coupled. The package of the present invention, if a chip carrier, is thus able to uniquely couple high speed chips on opposite surfaces thereof to assure a finished chip carrier assembly possessing far greater operational capabilities than heretofore known in the art.

Figure 6:
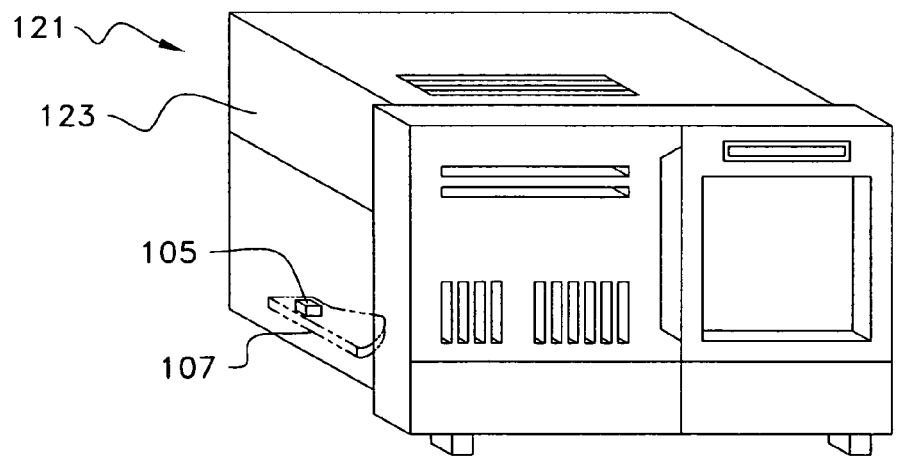
FIG. 6 is a perspective view of an information handling system having one (shown) or more of the electronic packages of the invention as part thereof.

In FIG. 6, there is shown an information handling system 121 in which the subject invention may be utilized. By way of example, system 121 may be a server (as shown), a personal computer, mainframe or similar information handling system known in the art. It is well-known in the information handling systems art that these structures include circuit boards and other packages as part thereof. In the instant invention, system 121 is shown to include a housing 123 of conventional construction and is also shown as including an electronic package 105 of the invention positioned therein, e.g., upon a "motherboard" substrate as are known in such systems. The "motherboard" is in turn electrically coupled to other components of the system as known. The positioning relationship of package 105 is for illustration purposes only in that this assembly can also be located at other locations within the system, including substantially perpendicular to the orientation shown. It is also understood that several such packages may be utilized in such a system, depending on the operational requirements thereof. If the system is a computer, server, mainframe or the like, it will include a central processing unit (CPU), one or more input/output (I/O) devices, and one or more random access storage devices, all of which are known in the art and further description is not needed. Such added devices and supporting components are also not shown in FIG. 1, for ease of illustration. System 121 may also include various peripheral devices functionally operable therewith, including keyboards, mice, displays, printers, speakers and modems. The components, including positioning thereof within or in operational relationship to a computer, server, mainframe, etc., are also well known in the art and further description not deemed necessary.

The electronic package as defined herein is capable of providing high frequency (high speed) connections between the electrical components positioned on the package substrate, as well as within other parts of the package. Such high speed connections are considered essential in the rapidly expanding packaging and information handling system art, due primarily to the corresponding increased requirements of such structures. The present invention as defined herein thus provides a significant advancement in the art.

Thus there has been shown and described a multi-chip electronic package which, in one embodiment, may comprise an organic, laminate chip carrier and a plurality of semiconductor chips spacedly positioned on a first surface thereof. In another embodiment, the package may comprise a PCB for the substrate and have the plurality of chip carriers (serving as the electrical components) mounted thereon. There has also been shown and described an example of an electronic package assembly in which a plurality of electrically conductive elements (e.g., solder balls) are used to connect the package to its designated base structure (e.g., a PCB). Significantly, if a chip carrier, the substrate may be of an organic material of the type defined herein and yet which is able to satisfactorily hold two or more high-temperature semiconductor chips thereon without adversely affecting the underlying substrate material. Of still further significance, the components for the invention may be coupled in a high-speed manner so as to assure higher frequency signal passage there-between, thus resulting in a final product structure possessing greater capabilities than heretofore known in the art. The invention as defined herein thus possesses many significant advantages over known packages, including those of the multi-chip variety. The method defined herein for assembling this structure can also be conducted using many known PCB procedures and thus at a relatively lower cost than other processes used to form products of this type.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate comprising first and second dielectric layers, a first conductive layer positioned on said first dielectric layer and a second conductive layer positioned on said second dielectric layer, said first and second conductive layers each including a plurality of conductive lines, said first conductive layer further having a first pattern of electrical component contact sites and a plurality of second patterns of electrical component contact sites substantially surrounding said first pattern of electrical component contact sites and spaced from said first pattern of electrical component contact sites, each of said patterns of electrical component contact sites including at least twenty such contact sites, each of said second patterns of electrical component contact sites surrounding said first pattern, and
 - a first plurality of said conductive lines interconnecting selected ones of said contacts sites of said first pattern of electrical component contact sites with selected ones of said contact sites of said second pattern of electrical component contact sites,
 - selected ones of said first plurality of conductive lines each including selected ones of said conductive lines of said first conductive layer and said conductive lines of said second conductive layer,
 - while selected ones of others of said first plurality of conductive lines including only conductive lines of said first conductive layer,
 - said conductive lines of said second conductive layer being electrically coupled to said selected ones of said conductive lines of said first conductive layer, said selected ones of others of said first plurality of conductive lines being of substantially the same length.

2. The circuitized substrate of claim 1 further including at least one thru-hole, said thru-hole electrically connecting at least one of said conductive lines of said first conductive layer to one of said conductive lines of said second conductive layer.

3. The circuitized substrate of claim 1 wherein said electrical component contact sites are solder ball contact pads.

4. An electronic package comprising:
 - a circuitized substrate including first and second dielectric layers, a first conductive layer positioned on said first dielectric layer and a second conductive layer positioned on said second dielectric layer, said first and second conductive layers each including a plurality of conductive lines, said first conductive layer further having a first pattern of electrical component contact sites and a plurality of second patterns of electrical component contact sites substantially surrounding said first pattern of electrical component contact sites and spaced from said first pattern of electrical component contact sites each of said first and second patterns of electrical component contact sites including at least twenty such contact sites, each of said second patterns of electrical component contact sites surrounding said first pattern, a first plurality of said conductive lines interconnecting selected ones of said contacts sites of said first pattern of electrical component contact sites with selected ones of said contact sites of said second patterns of electrical component contact sites,
 - selected ones of said first plurality of conductive lines including selected ones of said conductive lines of said first conductive layer and said conductive lines of said second conductive layer,
 - while selected ones of others of said first plurality of conductive lines include only conductive lines of said first conductive layer,
 - said conductive lines of said second conductive layer being electrically coupled to said selected ones of said conductive lines of said first conductive layer, said selected ones of others of said first plurality of conductive lines interconnecting said selected ones of said contacts sites of said first and second patterns being of substantially the same length; and
 - a plurality of electrical components positioned on said first conductive layer of said circuitized substrate, each of said plurality of electrical components being electrically coupled to a respective one of said first and second patterns of electrical component contact sites and therefore to one another by said selected ones of others of said first plurality of conductive lines interconnecting said selected ones of said contacts sites of said first and second patterns and which are of said substantially the same length.

5. The electronic package of claim 4 wherein each of said electrical components include at least one semiconductor chip.

6. The electronic package of claim 5 wherein the number of said electrical components is five.

7. The electronic package of claim 6 wherein at least one of said electrical components includes a main processing semiconductor chip and the remainder of said electrical components include at least one memory semiconductor chip.

8. The electronic package of claim 4 further including at least one thru-hole, said thru-hole electrically connecting at least one of said conductive lines of said first conductive layer to one of said conductive lines of said conductive layer.

9. The electronic package of claim 4 wherein said electrical component contact sites are solder ball contact pads.

* * * * *

UNITED STATES PATENT AND TRADEMARK OFFICE
CERTIFICATE OF CORRECTION

| | |
|---|---|
| PATENT NO. | : 7,332,818 B2 |
| APPLICATION NO. | : 11/127160 |
| DATED | : February 19, 2008 |
| INVENTOR(S) | : Irving Memis |

It is certified that error appears in the above-identified patent and that said Letters Patent is hereby corrected as shown below:

Col. 16 Claim 4 - line 38 - delete "contacts" and insert --contact--.
Col. 16 Claim 8 - line 55 - insert --second-- after second occurrence of "said".

Signed and Sealed this

Twenty-fourth Day of June, 2008

JON W. DUDAS
*Director of the United States Patent and Trademark Office*